(12) United States Patent
Yu et al.

(10) Patent No.: US 9,893,028 B2
(45) Date of Patent: Feb. 13, 2018

(54) BOND STRUCTURES AND THE METHODS OF FORMING THE SAME

(71) Applicant: Taiwan Semiconductor Manufacturing Company, Ltd., Hsin-Chu (TW)

(72) Inventors: Chen-Hua Yu, Hsin-Chu (TW); Wen-Chih Chiou, Zhunan Township (TW); Ming-Fa Chen, Taichung (TW); Yi-Hsiu Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/980,044

(22) Filed: Dec. 28, 2015

(65) Prior Publication Data

US 2017/0186715 A1 Jun. 29, 2017

(51) Int. Cl.
*H01L 21/768* (2006.01)
*H01L 23/00* (2006.01)
(Continued)

(52) U.S. Cl.
CPC ........ *H01L 24/06* (2013.01); *H01L 21/31051* (2013.01); *H01L 21/76802* (2013.01);
(Continued)

(58) Field of Classification Search
CPC ......... H01L 24/06; H01L 24/03; H01L 24/14; H01L 23/5226; H01L 21/31051; H01L 21/76802; H01L 24/89; H01L 21/76877; H01L 2224/80896; H01L 2224/05025; H01L 2224/80895; H01L 2224/0382; H01L 2224/0346; H01L 2924/14;
(Continued)

(56) References Cited

U.S. PATENT DOCUMENTS

| 6,525,551 B1 * | 2/2003 | Beaman ............ G01R 1/07307 |
| | | 324/756.03 |
| 7,838,424 B2 | 11/2010 | Karta et al. |

(Continued)

FOREIGN PATENT DOCUMENTS

DE 102007057689 A1 6/2009
JP 2009246218 A 10/2009
(Continued)

*Primary Examiner* — Caleen Sullivan
(74) *Attorney, Agent, or Firm* — Slater Matsil, LLP

(57) ABSTRACT

A method includes forming a first conductive feature and a second conductive feature, forming a metal pad over and electrically connected to the first conductive feature, and forming a passivation layer covering edge portions of the metal pad, with a center portion of a top surface of the metal pad exposed through an opening in the metal pad. A first dielectric layer is formed to cover the metal pad and the passivation layer. A bond pad is formed over the first dielectric layer, and the bond pad is electrically coupled to the second conductive feature. A second dielectric layer is deposited to encircle the bond pad. A planarization is performed to level a top surface of the second dielectric layer with the bond pad. At a time after the planarization is performed, an entirety of the top surface of the metal pad is in contact with dielectric materials.

20 Claims, 25 Drawing Sheets

(51) Int. Cl.
*H01L 21/3105* (2006.01)
*H01L 23/522* (2006.01)

(52) U.S. Cl.
CPC .... *H01L 21/76877* (2013.01); *H01L 23/5226* (2013.01); *H01L 24/03* (2013.01); *H01L 24/14* (2013.01); *H01L 24/89* (2013.01); *H01L 2224/037* (2013.01); *H01L 2224/0346* (2013.01); *H01L 2224/0382* (2013.01); *H01L 2224/05022* (2013.01); *H01L 2224/05025* (2013.01); *H01L 2224/0612* (2013.01); *H01L 2224/80895* (2013.01); *H01L 2224/80896* (2013.01); *H01L 2924/14* (2013.01)

(58) Field of Classification Search
CPC ....... H01L 2224/037; H01L 2224/0612; H01L 2224/05022; H01L 2224/04042; H01L 24/05; H01L 24/11; H01L 24/13; H01L 2224/11462; H01L 2224/11464; H01L 2224/13022; H01L 2224/1146; H01L 23/53238; H01L 2224/0391; H01L 2224/05093; H01L 23/585; H01L 21/4846; H01L 2224/1191
USPC ........................................................ 257/774
See application file for complete search history.

(56) References Cited

U.S. PATENT DOCUMENTS

| | | | |
|---|---|---|---|
| 7,863,742 B2 | 1/2011 | Yu et al. | |
| 7,932,601 B2 | 4/2011 | Chang et al. | |
| 8,283,247 B2 | 10/2012 | Lehr et al. | |
| 8,754,508 B2 | 6/2014 | Chen et al. | |
| 8,772,151 B2 | 7/2014 | Chen | |
| 8,846,548 B2 | 9/2014 | Tu et al. | |
| 9,117,825 B2 | 8/2015 | Liu et al. | |
| 9,646,901 B2 | 5/2017 | Akiba et al. | |
| 2012/0306070 A1 | 12/2012 | Yew et al. | |
| 2013/0320522 A1 | 12/2013 | Lai et al. | |
| 2013/0341800 A1 | 12/2013 | Tu et al. | |
| 2014/0015122 A1 | 1/2014 | Chou et al. | |
| 2014/0045379 A1 | 2/2014 | Chen | |
| 2014/0048926 A1 | 2/2014 | Wang et al. | |
| 2014/0077356 A1 | 3/2014 | Chen et al. | |
| 2014/0183693 A1 | 7/2014 | Tsai et al. | |
| 2014/0187103 A1 | 7/2014 | Chen et al. | |
| 2014/0252558 A1 | 9/2014 | Yu et al. | |
| 2014/0252597 A1 | 9/2014 | Tsai et al. | |
| 2014/0252601 A1 | 9/2014 | Lu et al. | |
| 2014/0252608 A1 | 9/2014 | Chen et al. | |
| 2014/0256087 A1* | 9/2014 | Liu | H01L 24/03 438/107 |
| 2014/0262468 A1 | 9/2014 | Chen et al. | |
| 2014/0264885 A1 | 9/2014 | Tsai et al. | |
| 2015/0348905 A1 | 12/2015 | Tsai et al. | |

FOREIGN PATENT DOCUMENTS

| | | |
|---|---|---|
| JP | 2013016721 A | 1/2013 |
| KR | 1020130134991 A | 12/2013 |
| KR | 1020150137971 A | 12/2015 |
| TW | 201423936 | 6/2014 |

* cited by examiner

BOND STRUCTURES AND THE METHODS OF FORMING THE SAME

BACKGROUND

In the formation of integrated circuits, devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

Post-passivation interconnect (PPI) is then formed to connect to the top surface of the metal pad, followed by the formation of a second polymer layer over the PPI. An Under-Bump-Metallurgy (UBM) is formed extending into an opening in the second polymer layer, wherein the UBM is electrically connected to the PPI. A solder ball is then placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
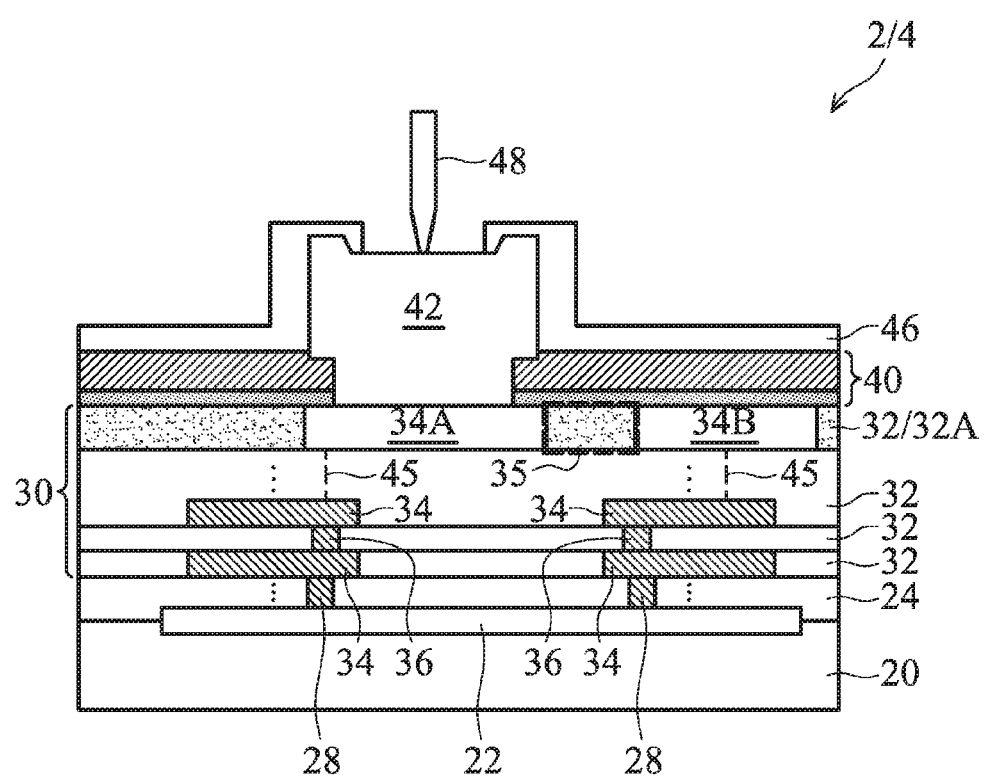
FIGS. 1 through 11 illustrate the cross-sectional views of intermediate stages in the formation of a bond structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A bond structure and the method of forming the same are provided in accordance with various exemplary embodiments. The intermediate stages of forming the bond structures are illustrated. Some variations of some embodiments are discussed. Throughout the various views and illustrative embodiments, like reference numbers are used to designate like elements.

Figure 25:
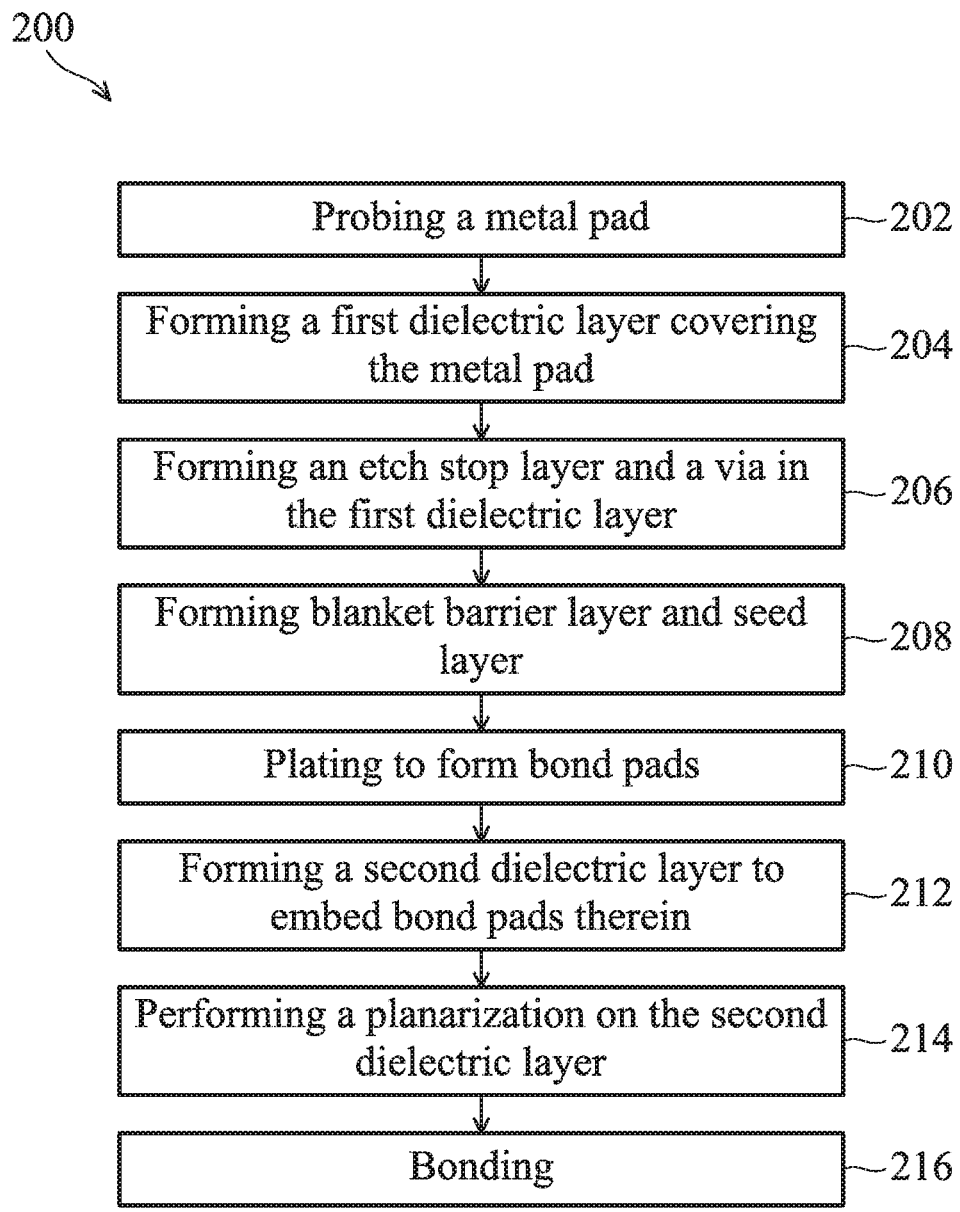
FIG. 25 illustrates a process flow for forming a bond structure in accordance with some embodiments.

FIGS. 1 through 11 illustrate the cross-sectional views of intermediate stages in the formation of a bond structure in accordance with some embodiments. The steps shown in FIGS. 1 through 11 are also illustrated schematically in the process flow shown in FIG. 25.

FIG. 1 illustrates a cross-sectional view of package component 2. In accordance with some embodiments of the present disclosure, package component 2 is a device wafer including active devices such as transistors and/or diodes, and possibly passive devices such as capacitors, inductors, resistors, or the like. Device wafer 2 may include a plurality of chips 4 therein, with one of chips 4 illustrated. In accordance with alternative embodiments of the present disclosure, package component 2 is an interposer wafer, which may or may not include active devices and/or passive devices. In accordance with yet alternative embodiments of the present disclosure, package component 2 is a package substrate strip, which includes core-less package substrates or the package substrates with cores therein. In subsequent discussion, a device wafer is discussed as an exemplary package component 2. The teaching of the present disclosure may also be applied to interposer wafers, package substrates, packages, etc.

In accordance with some embodiments of the present disclosure, the exemplary wafer 2 includes semiconductor substrate 20 and the features formed at a top surface of semiconductor substrate 20. Semiconductor substrate 20 may be formed of crystalline silicon, crystalline germanium, silicon germanium, and/or a III-V compound semiconductor such as GaAsP, AlInAs, AlGaAs, GaInAs, GaInP, GaInAsP, and the like. Semiconductor substrate 20 may also be a bulk silicon substrate or a Silicon-On-Insulator (SOI) substrate. Shallow Trench Isolation (STI) regions (not shown) may be formed in semiconductor substrate 20 to isolate the active regions in semiconductor substrate 20. Although not shown, through-vias may be formed to extend into semiconductor substrate 20, wherein the through-vias are used to electrically inter-couple the features on opposite sides of wafer 2.

In accordance with some embodiments of the present disclosure, wafer 2 includes integrated circuit devices 22, which are formed on the top surface of semiconductor substrate 20. Exemplary integrated circuit devices 22 include Complementary Metal-Oxide Semiconductor (CMOS) transistors, resistors, capacitors, diodes, and the like. The details of integrated circuit devices 22 are not illustrated herein. In accordance with alternative embodiments, wafer 2 is used for forming interposers, wherein substrate 20 may be a semiconductor substrate or a dielectric substrate. Inter-Layer Dielectric (ILD) 24 is formed over semiconductor substrate 20 and fills the space between the gate stacks of transistors (not shown) in integrated circuit devices 22. In accordance with some exemplary embodiments, ILD 24 is formed of phosphosilicate glass (PSG), borosilicate glass (BSG), boron-doped phosphosilicate glass (BPSG), fluorine-doped silicate glass (FSG), tetraethyl orthosilicate (TEOS), or the like. ILD 24 may be formed using spin coating, Flowable Chemical Vapor Deposition (FCVD), or the like. In accordance with some embodiments of the present disclosure, ILD 24 is formed using a deposition method such as Plasma Enhanced Chemical Vapor Deposition (PECVD), Low Pressure Chemical Vapor Deposition (LPCVD), or the like.

Contact plugs 28 are formed in ILD 24, and are used to electrically connect integrated circuit devices 22 to overlying metal lines, and vias. In accordance with some embodiments of the present disclosure, contact plugs 28 are formed of a conductive material selected from tungsten, aluminum, copper, titanium, tantalum, titanium nitride, tantalum nitride, alloys therefore, and/or multi-layers thereof. The formation of contact plugs 28 may include forming contact openings in ILD 24, filling a conductive material(s) into the contact openings, and performing a planarization (such as Chemical Mechanical Polish (CMP)) to level the top surfaces of contact plugs 28 with the top surface of ILD 24.

Over ILD and contact plugs 28 is interconnect structure 30. Interconnect structure 30 includes metal lines 34 and vias 36, which are formed in dielectric layers 32. The combination of metal lines at a same level is referred to as a metal layer hereinafter. In accordance with some embodiments of the present disclosure, interconnect structure 30 includes a plurality of metal layers that are interconnected through vias 36. Metal lines 34 and vias 36 may be formed of copper or copper alloys, and they can also be formed of other metals. In accordance with some embodiments of the present disclosure, dielectric layers 32 are formed of low-k dielectric materials. The dielectric constants (k values) of the low-k dielectric materials may be lower than about 3.0, or lower than about 2.5, for example.

Dielectric layers 32 are alternatively referred to as Inter-Metal Dielectric (IMD) layer 32 hereinafter. In accordance with some embodiments of the present disclosure, at least the lower ones of dielectric layers 32 are formed of a low-k dielectric material having a dielectric constant (k-value) lower than about 3.0, about 2.5, or even lower. Dielectric layers 32 may comprise Black Diamond (a registered trademark of Applied Materials), a carbon-containing low-k dielectric material, Hydrogen SilsesQuioxane (HSQ), MethylSilsesQuioxane (MSQ), or the like. Dielectric layers 32 may also have a low-k value, which may be lower than about 3.0, 2.5, or 2.0. In accordance with some embodiments of the present disclosure, the formation of dielectric layers 32 includes depositing a porogen-containing dielectric material and then performing a curing process to drive out the porogen, and hence the remaining dielectric layers 32 is porous.

Metal lines 34 and vias 36 are formed in dielectric layers 32. The formation process may include single damascene and dual damascene processes. In an exemplary single damascene process, a trench is first formed in one of dielectric layers 32, followed by filling the trench with a conductive material. A planarization such as CMP is then performed to remove the excess portions of the conductive material higher than the top surface of the IMD layer, leaving a metal line in the trench. In a dual damascene process, both a trench and a via opening are formed in an IMD layer, with the via opening underlying and connected to the trench. The conductive material is then filled into the trench and the via opening to form a metal line and a via, respectively. The conductive material may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines or pads 34A and 34B in a top metallization layer, which is in one of dielectric layers 32 (marked as dielectric layer 32A). It is appreciated that although metal features 34A and 34B are illustrated as discrete features separated by dielectric layer 32A, they may also be portions of a continuous metallic feature, as indicated by dashed rectangle 35, which represents a conductive portion interconnecting metal features 34A and 34B. In accordance with some embodiments, dielectric layer 32A is formed of a low-k dielectric material similar to the material of lower ones of dielectric layers 32. In accordance with other embodiments, dielectric layer 32A is formed of a non-low-k dielectric material, which may include silicon nitride, Undoped Silicate Glass (USG), silicon oxide, or the like. Dielectric layer 32A may also have a multi-layer structure including, for example, two USG layers and a silicon nitride layer in between. Top metal features 34A and 34B may also be formed of copper or a copper alloy, and may have a dual or single damascene structure.

Metal pad 42 is formed over and contacting metal feature 34A. Metal pad 42 is electrically coupled to integrated circuit devices 22 through conductive features such as metal lines 34 and vias 36 in accordance with some exemplary embodiments, wherein dashed lines 45 represent the electrical connections. Metal pad 42 may be an aluminum pad or an aluminum-copper pad, and other metallic materials may be used. In accordance with some embodiments of the present disclosure, metal pad 42 has an aluminum percentage greater than about 95 percent.

Passivation layer 40 (sometimes referred to as passivation-1) may be formed over interconnect structure 30. Passivation layer 46 (sometimes referred to as passivation-2) is formed over passivation layer 40. Some portions of passivation layer 46 may cover the edge portions of metal pads 42, and a central portion of a top surface of metal pad 42 is exposed through an opening in passivation layer 46. Each of passivation layers 40 and 46 may be a single layer or a composite layer, and may be formed of a non-porous material. In accordance with some embodiments of the present disclosure, one or both of passivation layers 40 and 46 is a composite layer including a silicon oxide layer and a silicon nitride layer over the silicon oxide layer.

FIG. 1 also illustrates a probing step, which may be a part of a wafer-acceptance-test or a circuit test. The respective step is shown as step 202 in the process flow shown in FIG. 25. The probing is performed to verify the functionality of the integrated circuit devices 22 and the respective electrical connections. The probing may be performed by contacting probe needle 48 to metal pad 42. Probe needle 48 may be a part of a probe card having a plurality of probe needles, for example, which is connected to a test equipment (not shown). Metal pad 42 is designed to be large enough for probing. In addition, metal pad 42 may be an aluminum pad, which is softer than copper, and hence is more suitable for the probing process than a copper pad.

Figure 2:
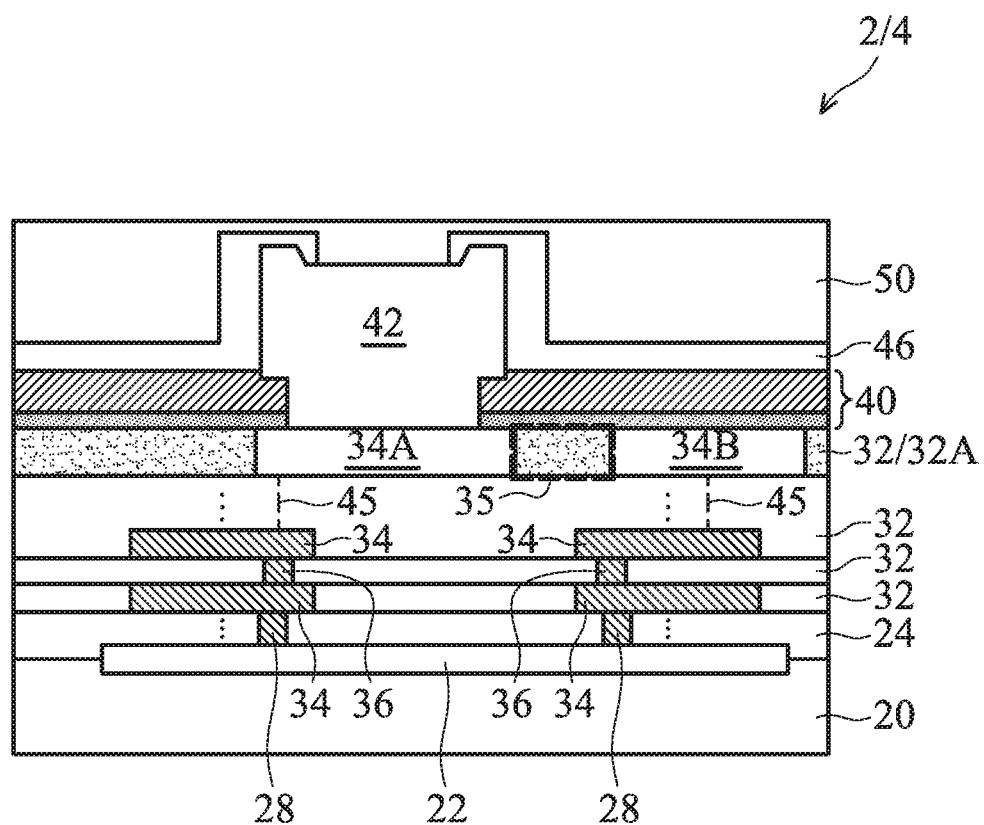

Referring to FIG. 2, dielectric layer 50 is deposited, and may be planarized, for example, in a Chemical Mechanical Polish (CMP) process. The respective step is shown as step 204 in the process flow shown in FIG. 25. The top surface of dielectric layer 50 is higher than the top surface of metal pad 42, and may be higher than the top ends of passivation layer 46.

Figure 3:
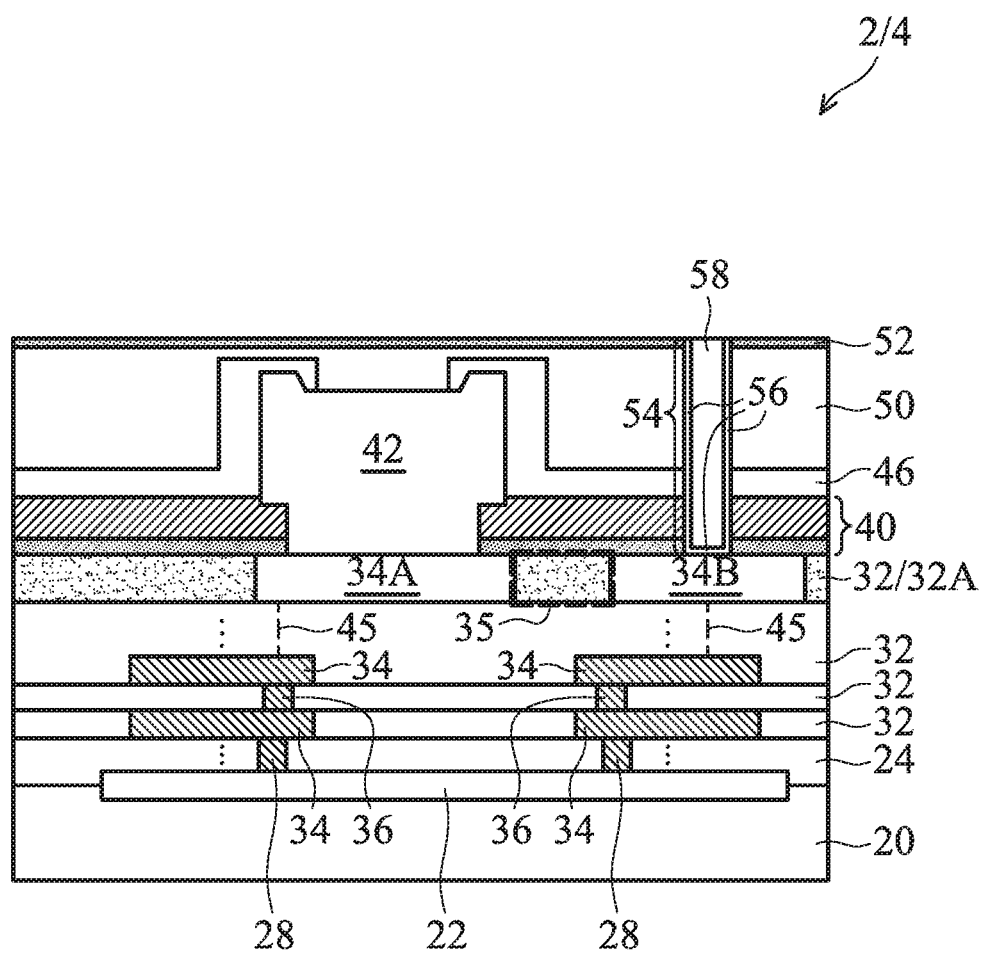

Next, as shown in FIG. 3, dielectric etch stop layer 52 is formed, followed by the formation of via 54. The respective steps are shown as step 206 in the process flow shown in FIG. 25. Dielectric etch stop layer 52 may be formed of a nitride such as silicon nitride. The formation of via 54 includes etching dielectric etch stop layer 52 and dielectric layer 50 to form a via opening, and then filling the via opening with conductive materials to form via 54. In accordance with some embodiments of the present disclosure, the filling of the via opening includes blanket depositing conductive barrier layer 56, forming a seed layer such as a copper layer, and then performing a plating process such as electrical or electro-less plating to plate metal 58 such as copper or copper alloy. Conductive barrier layer 56 may include titanium, titanium nitride, tantalum, tantalum nitride, or the like. A planarization such as a CMP is performed to remove excess portions of the conductive material, the seed layer, and the plated metal 58.

Figure 4:
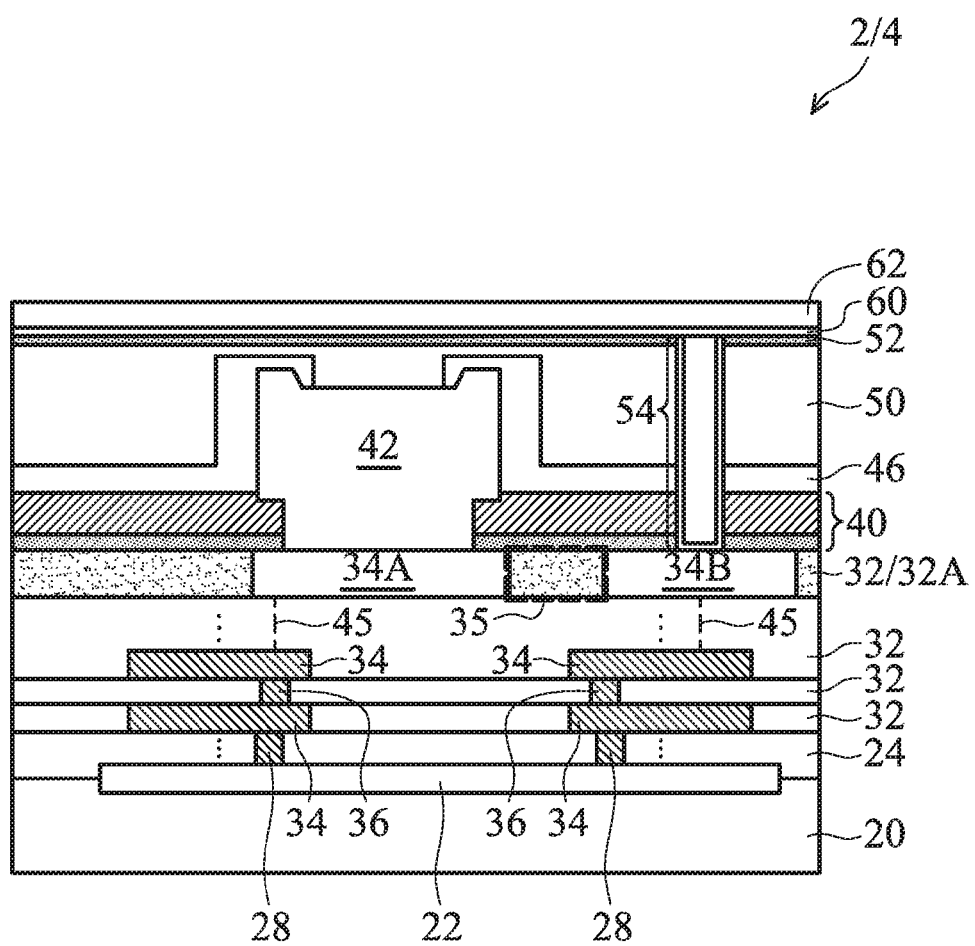
Figure 5:
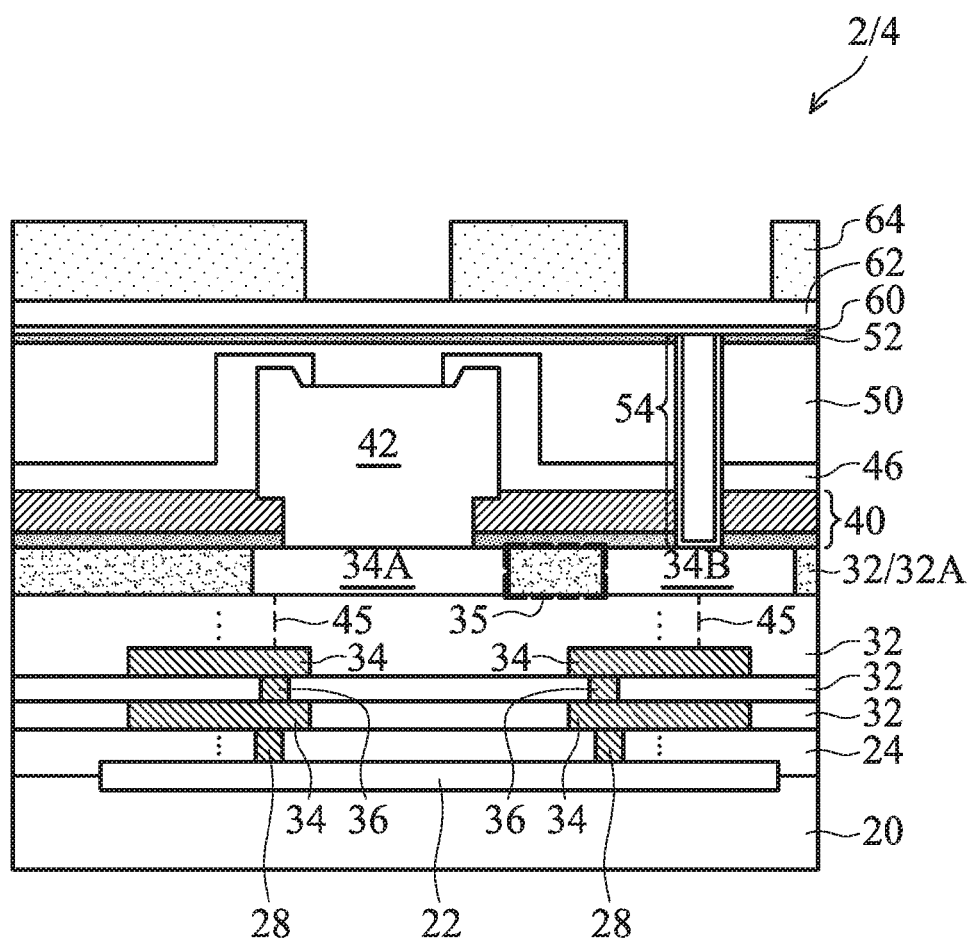
Figure 6:
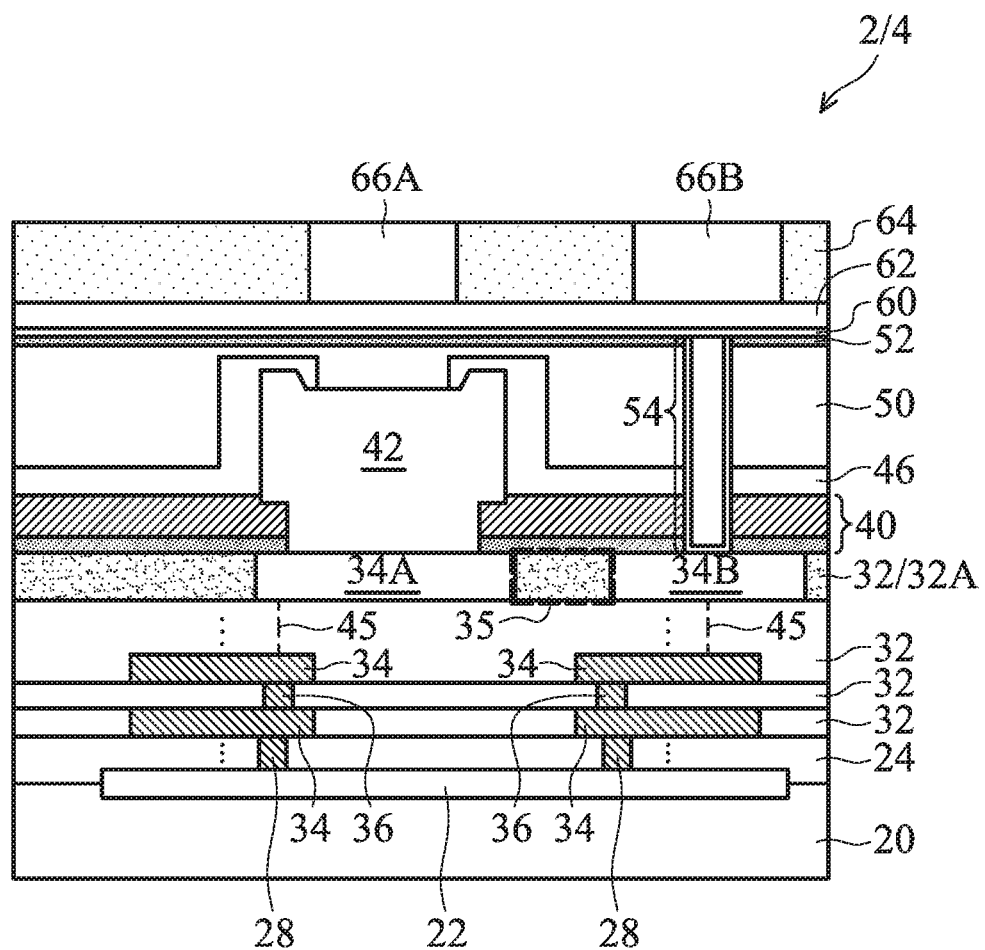

Referring to FIG. 4, conductive barrier layer 60 and seed layer 62 are formed, for example, using Physical Vapor Deposition (PVD). The respective step is shown as step 208 in the process flow shown in FIG. 25. Conductive barrier layer 60 may be formed of titanium, titanium nitride, tantalum, or tantalum nitride. Seed layer 62 may include copper. Next, as shown in FIG. 5, photo resist 64 is formed and patterned, and hence some portions of seed layer 62 are exposed. In a subsequent step, as shown in FIG. 6, a plating process is performed to form bond pads 66A and 66B from seed layer 62. The respective step is shown as step 210 in the process flow shown in FIG. 25. The plating may include an Electro-Chemical Plating (ECP), and electro-less plating, or the like.

As is shown in FIG. 4, seed layer 62 has horizontal portions and does not have vertical portions. As a result, the growth of bond pads 66A and 66B is upwardly, and does not include horizontal growth. Such a growth is beneficial for bond pads 66A and 66B (such as the copper grains) to have (111) surface orientation. Experimental results indicated that in some sample bond pads, 8,936 copper grains have the (111) surface orientation, and 2,715 copper grains have the (200) surface orientation, which means that the copper grains having the (111) surface orientation is 3.3 times the copper grains have the (200) surface orientation. Advantageously, since the copper with the (111) surface orientation is easier to diffuse than the copper with other surface orientations, it is easy for bond pads 66A and 66B to form metal-to-metal direct bonds in subsequent steps.

Figure 7:
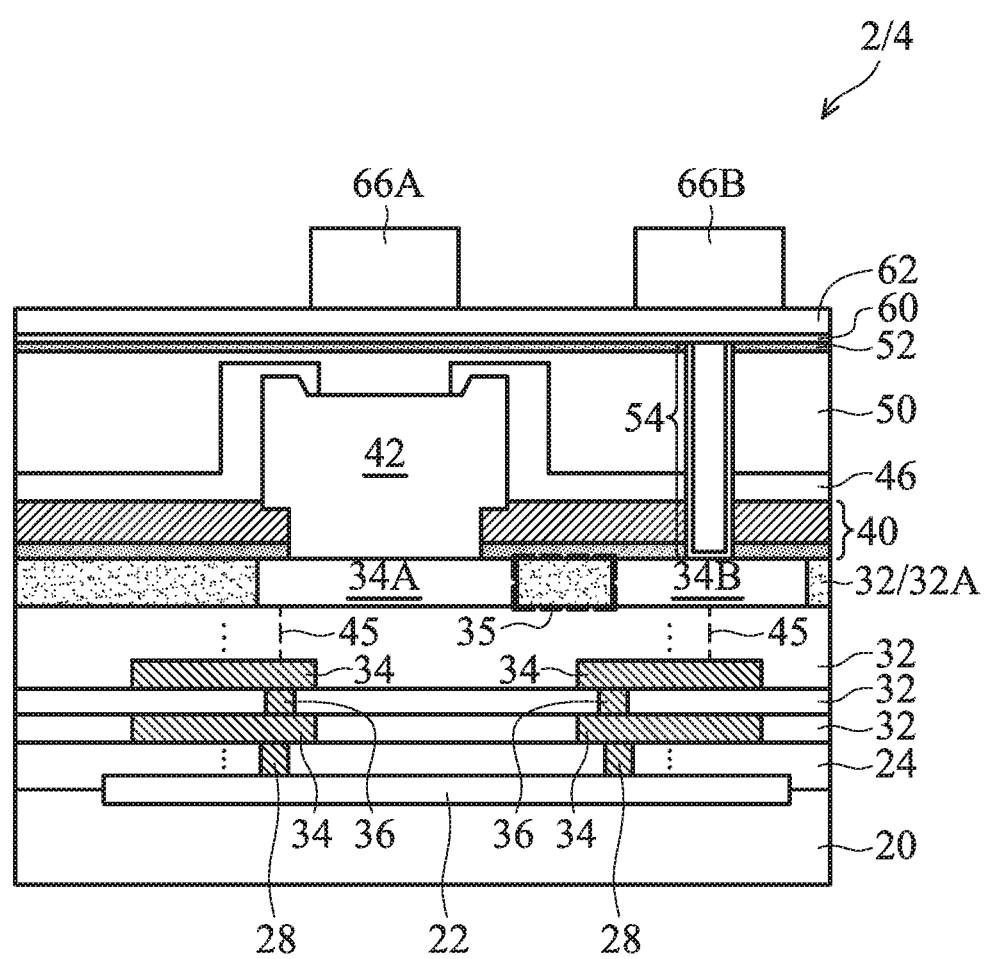
Figure 8:
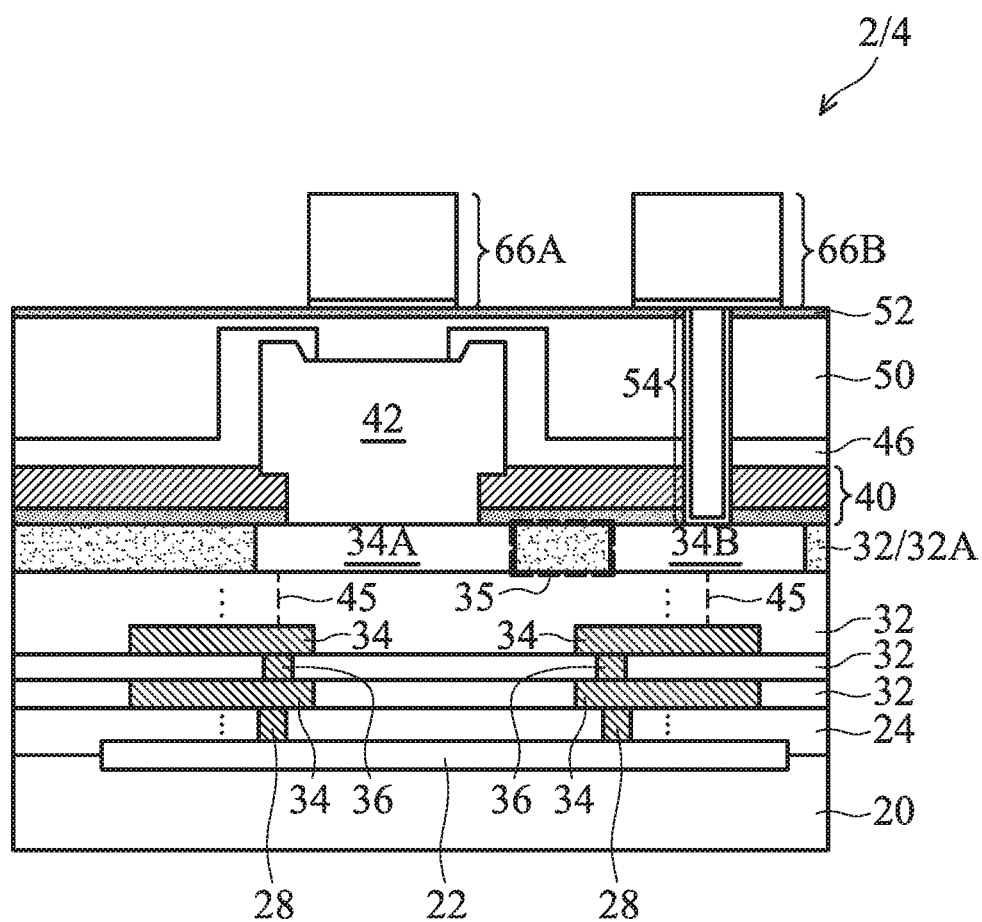

Photo resist 64 is then removed, resulting in the structure in FIG. 7. The portions of seed layer 62 and conductive barrier layer 60 covered by photo resist 64 are exposed. Next, the exposed portions of seed layer 62 and conductive barrier layer 60 are removed in an etching step, and the resulting structure is shown in FIG. 8. During the etching, dielectric etch stop layer 52 is used to stop the etching of conductive barrier layer 60. Throughout the description, the remaining portions of seed layer 62 and conductive barrier layer 60 that are directly underlying bond pads 66A and 66B are also considered as parts of bond pads 66A and 66B. Bond pad 66A may be directly overlapping metal pad 42 in accordance with some embodiments.

Figure 9:
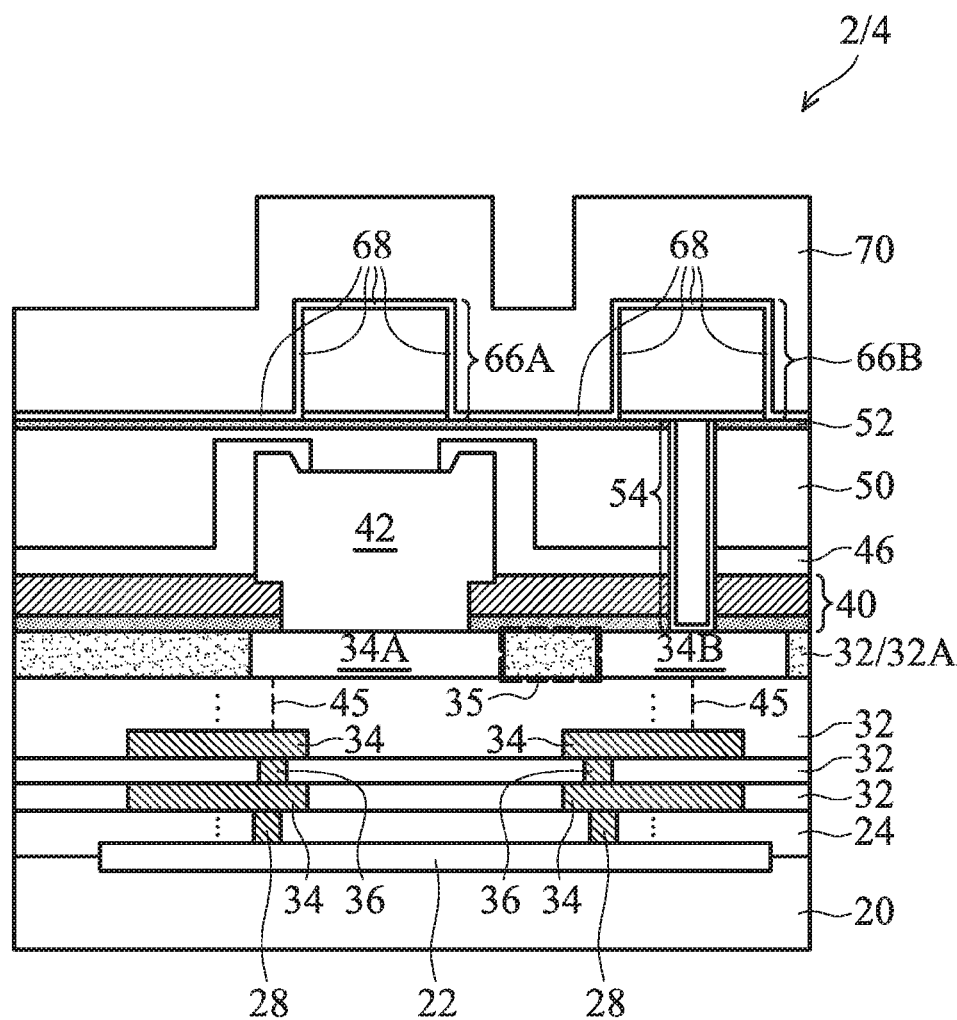

FIG. 9 illustrates the deposition of dielectric barrier layer 68, which is deposited on the top surface and sidewalls of bond pads 66A and 66B, and on dielectric etch stop layer 52. Dielectric barrier layer 68 is deposited as a conformal layer, and may be formed using Atomic Layer Deposition (ALD). The sidewall portions of dielectric barrier layer 68 also fully encircle each of bond pads 66A and 66B. In accordance with some embodiments of the present disclosure, dielectric barrier layer 68 is formed of silicon carbo-nitride (SiCN), silicon nitride, or the like. Next, dielectric material 70 is deposited. The respective step is shown as step 212 in the process flow shown in FIG. 25. Dielectric material 70 is used for fusion bonding (also referred to as oxide-to-oxide bonding). In accordance with some embodiments, dielectric material 70 is formed of a silicon-containing dielectric material such as silicon oxide or silicon nitride.

Figure 10:
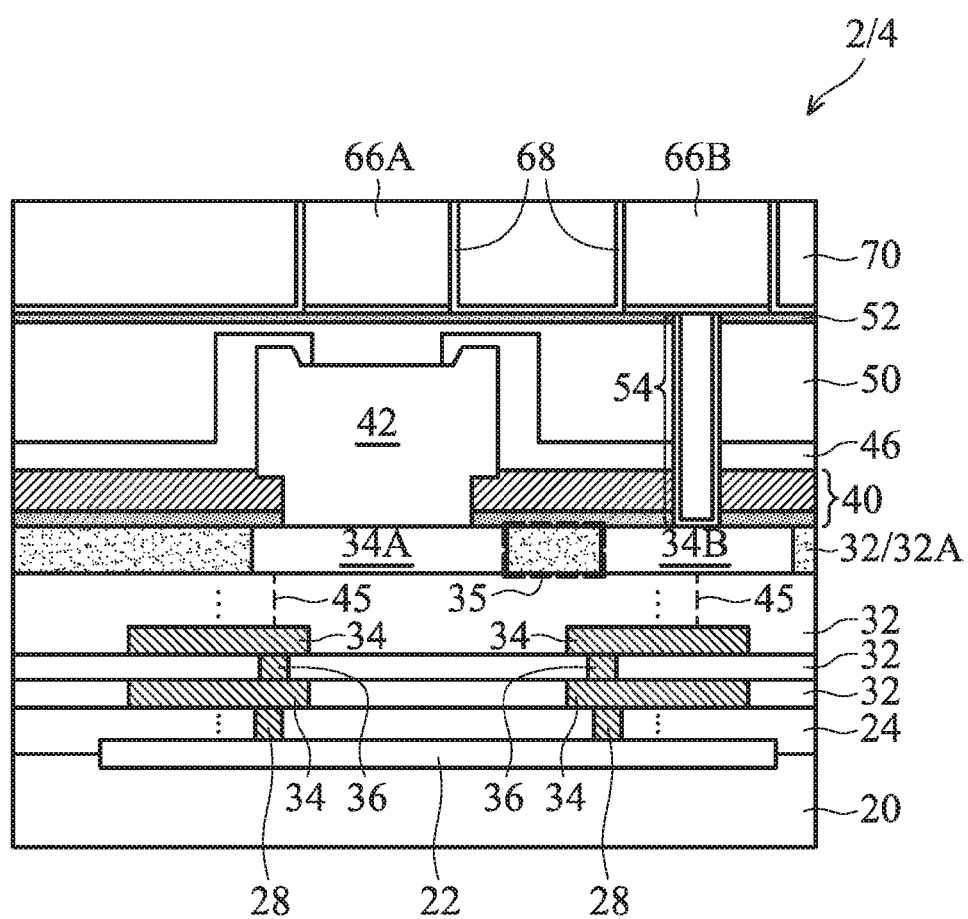

In a subsequent step, as shown in FIG. 10, the top portions of dielectric material 70 are removed in a planarization step such as a CMP step. The respective step is shown as step 214 in the process flow shown in FIG. 25. The portions of dielectric material 70 and dielectric barrier layer 68 higher than the top surfaces of bond pads 66A and 66B are also removed, and bond pads 66A and 66B are exposed. The top surfaces of the resulting bond pads 66A and 66B are coplanar with each other, and are coplanar with the top surface of dielectric layer 70.

Figure 11:
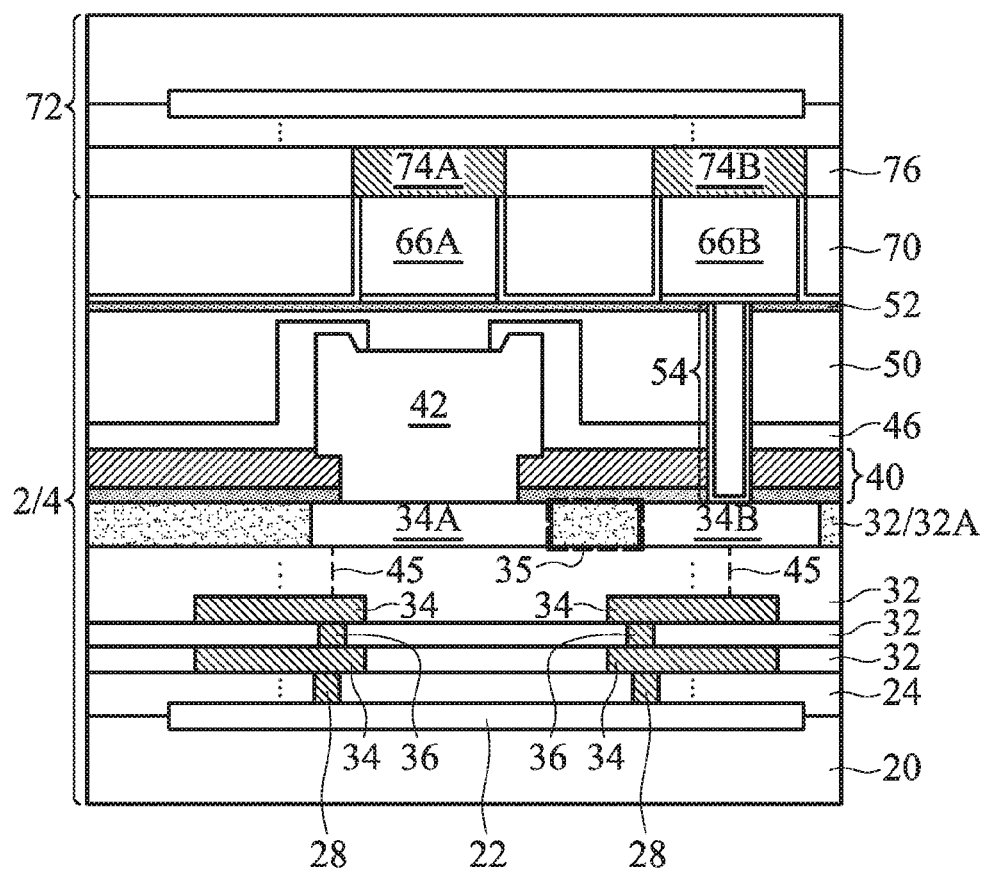

FIG. 11 illustrates the bonding of package component 72 to package component 2. The respective step is shown as step 216 in the process flow shown in FIG. 25. In accordance with some embodiments of the present disclosure, package component 72 is a device die, an interposer die, a package substrate, or a package. Package component 72 includes metal pads 74A and 74, which are bonded to bond pads 66A and 66B, respectively through metal-to-metal direct bonding. Also, package component 72 includes dielectric layer 76, which has a surface coplanar with the surfaces of metal pads 74A and 74. Dielectric layer 76 may also be a silicon-containing dielectric layer such as a silicon oxide layer. Dielectric layer 76 is bonded to dielectric layer 70 through fusion bonding. Accordingly, the resulting bond is a hybrid bond that includes the fusion bond and metal-to-metal direct bond. In accordance with some embodiments, the bonding includes a pre-bonding to bond package components 2 and 72 together, and an anneal to inter-diffuse the metals in bond pads 66A and 74A, and the metals in bond pads 66B and 74B. Since metal pads 66A and 66B have (111) surface orientations, and the copper with (111) surface orientations is easier to diffuse than the copper having other surface orientations, the resulting bonds may be achieved through lower annealing temperature and shorter annealing time. The resulting bonds are also stronger.

In the structure shown in FIG. 11, bond pad 66B has electrical functions, and may be electrically coupled to integrated circuit devices 22. Bond pad 66A, on the other hand, does not have the electrical function, and hence is a dummy bond pad. Dummy bond pad 66A is placed in region with a low density of bond pads, and has the function of reducing pattern-loading effect. As a result, the co-planarity of the top surfaces of bond pads 66A/66B and dielectric layer 70 is improved. In addition, with dummy bond pad 66A bonded to dummy bond pad 74A, package components 2 and 72 have improved bond strength. In accordance with some embodiments, bond pad 66A is electrically floating. Furthermore, bond pad 66A is fully encircled by dielectric barrier layer 68, and the bottom of bond pad 66A is also isolated from all other conductive features by dielectric etch stop layer 52 and dielectric layer 50. Accordingly, the sidewalls and bottom of bond pad 66A may not be in contact with any conductive material such as metal.

Furthermore, metal pad 42 is used for probing, and is not used for connecting metal pad 34A to any overlying conductive feature. The entirety of the top surface of metal pad 42 may be in contact with dielectric materials, and no conductive features is over and contacting the top surface of metal pad 42. Furthermore, metal pad 42, at a time when chip 4 is in operation (powered up), may have a voltage (either ground voltage or a non-zero volt voltage), but may not have current flowing through it. In accordance with some embodiments, small bond pads 66A and 66B (rather than the large metal pad 42) are used for bonding, and hence the pitch of bond pads is small. The embodiments of the present disclosure are thus suitable for fine-pitch I/O applications.

FIGS. 12 through 21 and FIGS. 22 through 24 illustrate cross-sectional views of intermediate stages in the formation of bond structures in accordance with some embodiments of the present disclosure. Unless specified otherwise, the materials and the formation methods of the components in these embodiments are essentially the same as the like components, which are denoted by like reference numerals in the embodiments shown in FIGS. 1 through 11. The details regarding the formation process and the materials of the components shown in FIGS. 12 through 24 may thus be found in the discussion of the embodiment shown in FIGS. 1 through 11.

Figure 12:
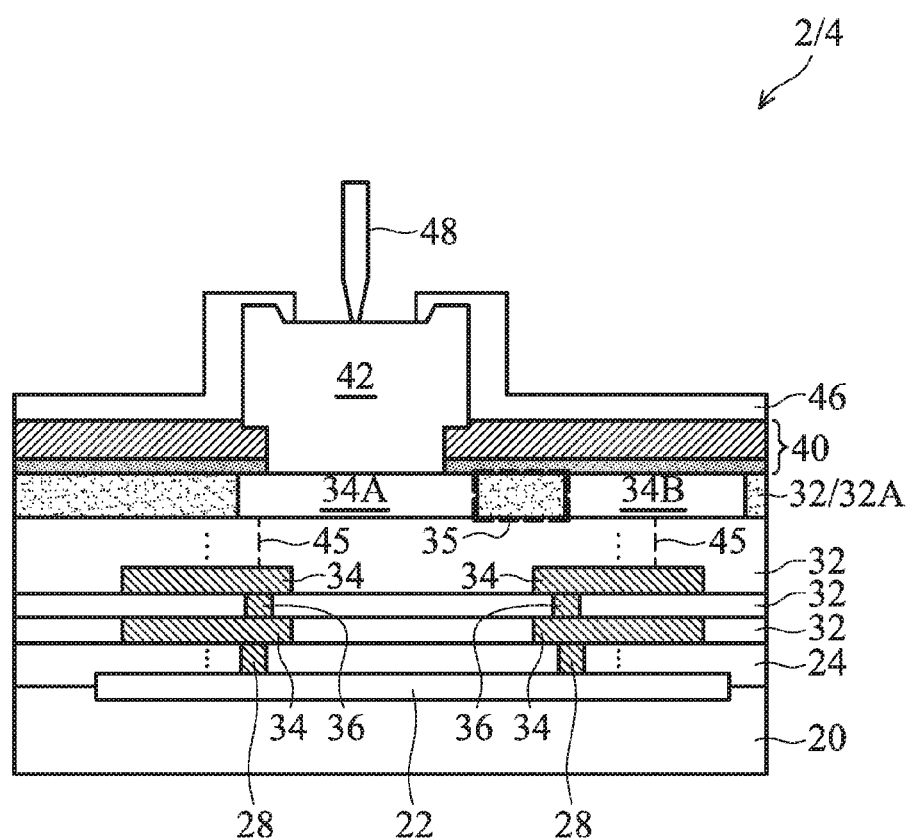
FIGS. 12 through 21 illustrate the cross-sectional views of intermediate stages in the formation of a bond structure in accordance with some embodiments.
Figure 13:
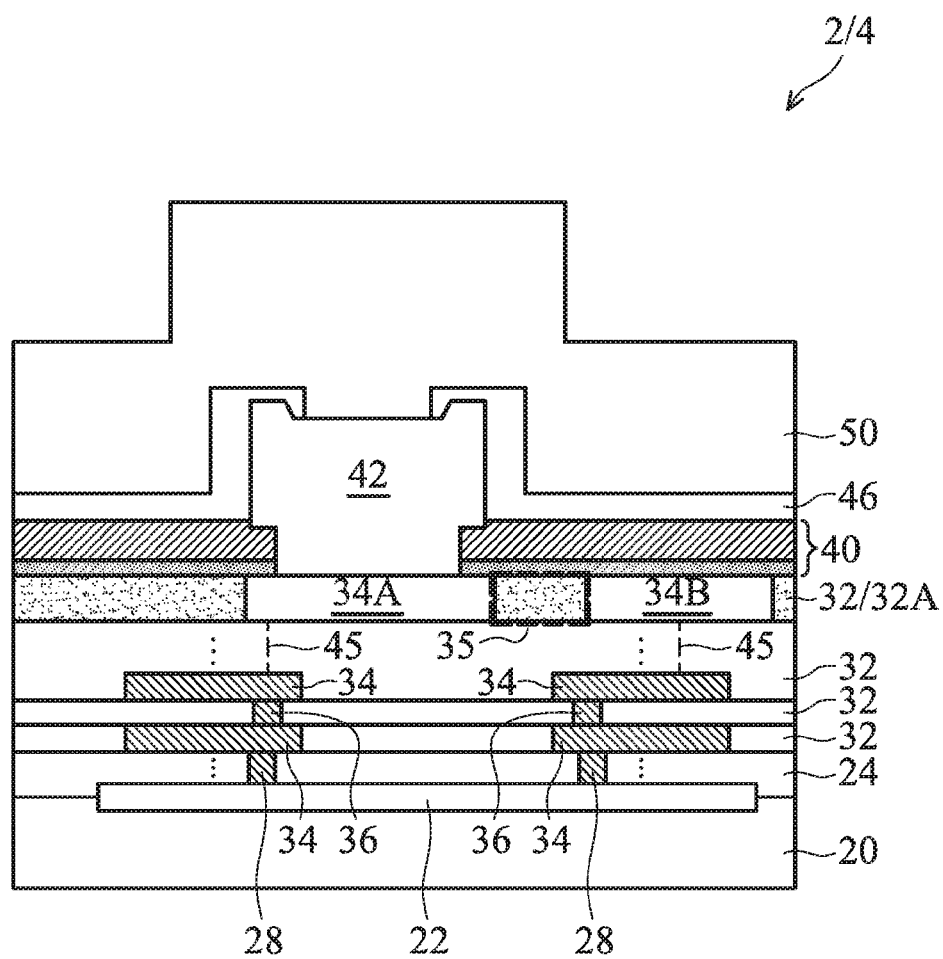

FIGS. 12 through 21 illustrate the cross-sectional views of intermediate stages in accordance with some embodiments, in which dummy metal pads and electrical metal pads are formed in separate steps. The initial steps of these embodiments are shown in FIG. 12, which is essentially the same as what are shown in FIG. 1. In a subsequent step, dielectric layer 50 is formed, as shown in FIG. 13, followed by a planarization to level the top surface of dielectric layer 50.

Figure 14:
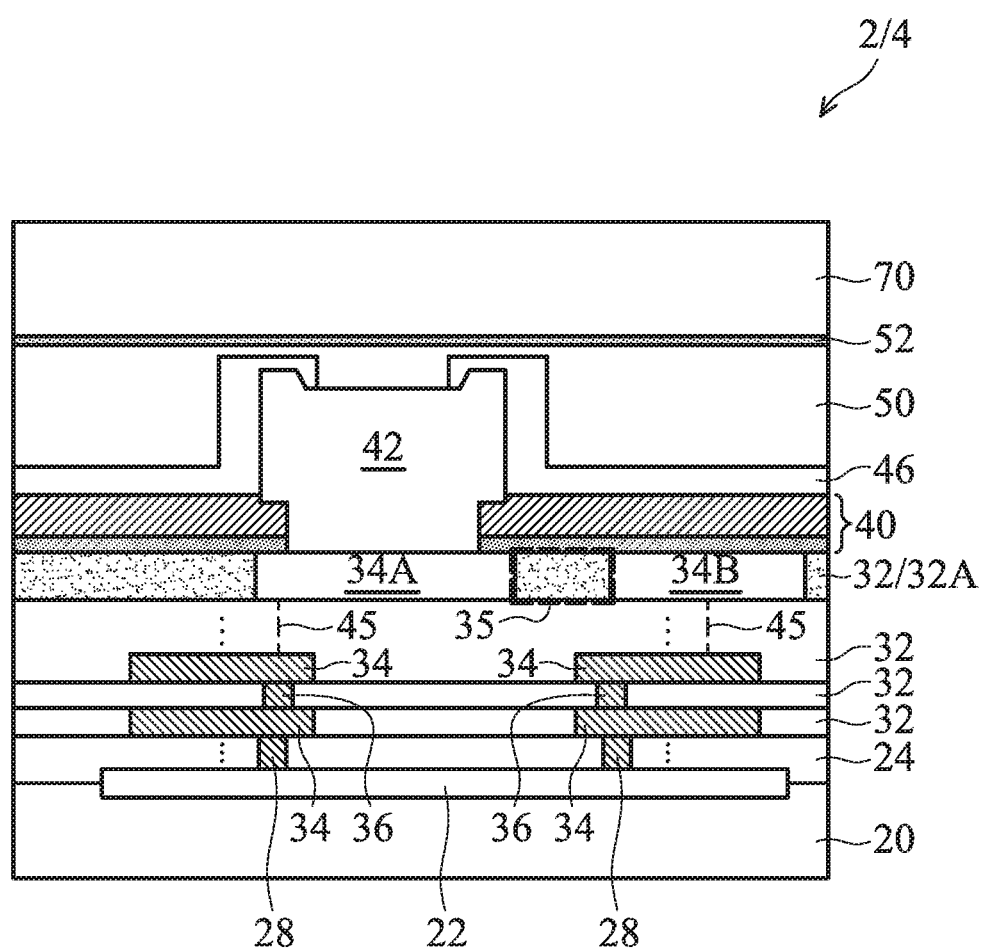
Figure 15:
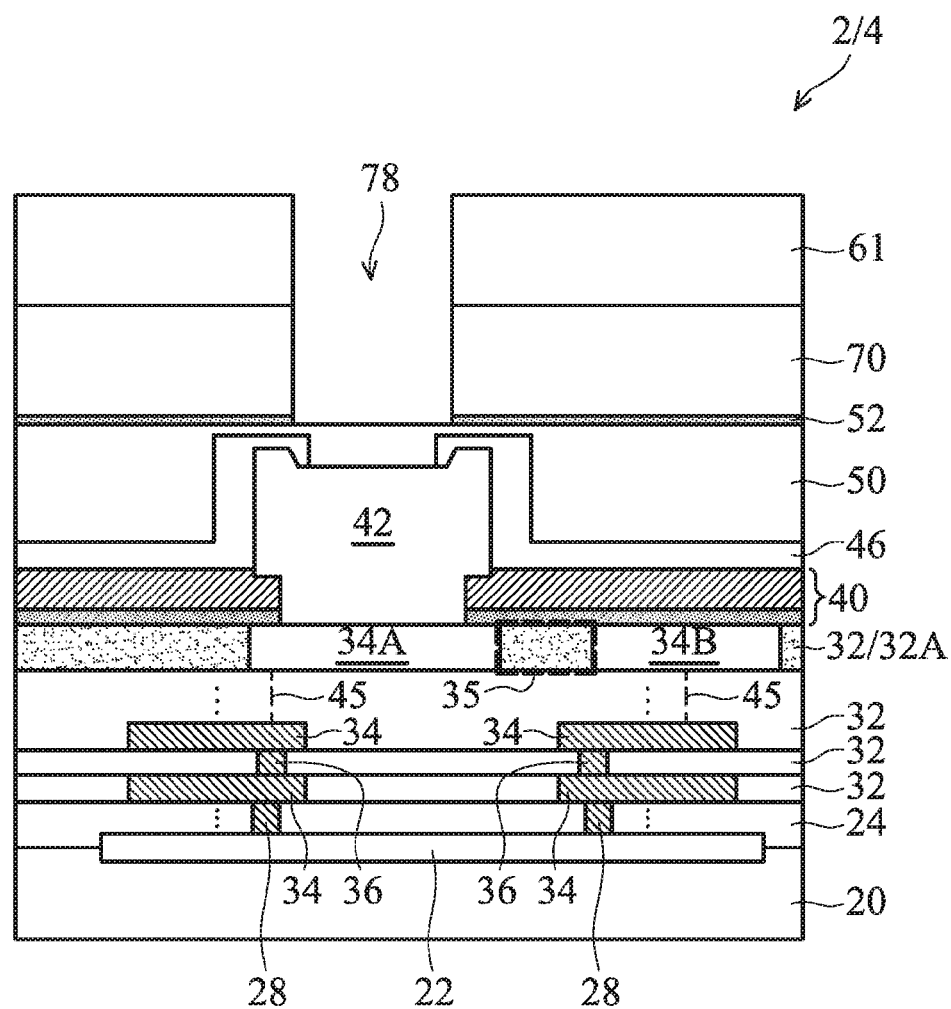

FIG. 14 illustrates the formation of dielectric etch stop layer 52 and dielectric layer 70. The materials may be the same as in the embodiments shown in FIG. 11. Next, referring to FIG. 15, photo resist 61 is applied and patterned, and is used to etch dielectric layer 70 in order to form opening 78. In accordance with some embodiments of the present disclosure, the etching stops on dielectric layer 50, as shown in FIG. 15, wherein etch stop layer 52 is etched through. In accordance with alternative embodiments, the etching stops on the top surface of etch stop layer 52, and etch stop layer 52 is at least not etched through. Photo resist 61 is then removed.

Figure 16:
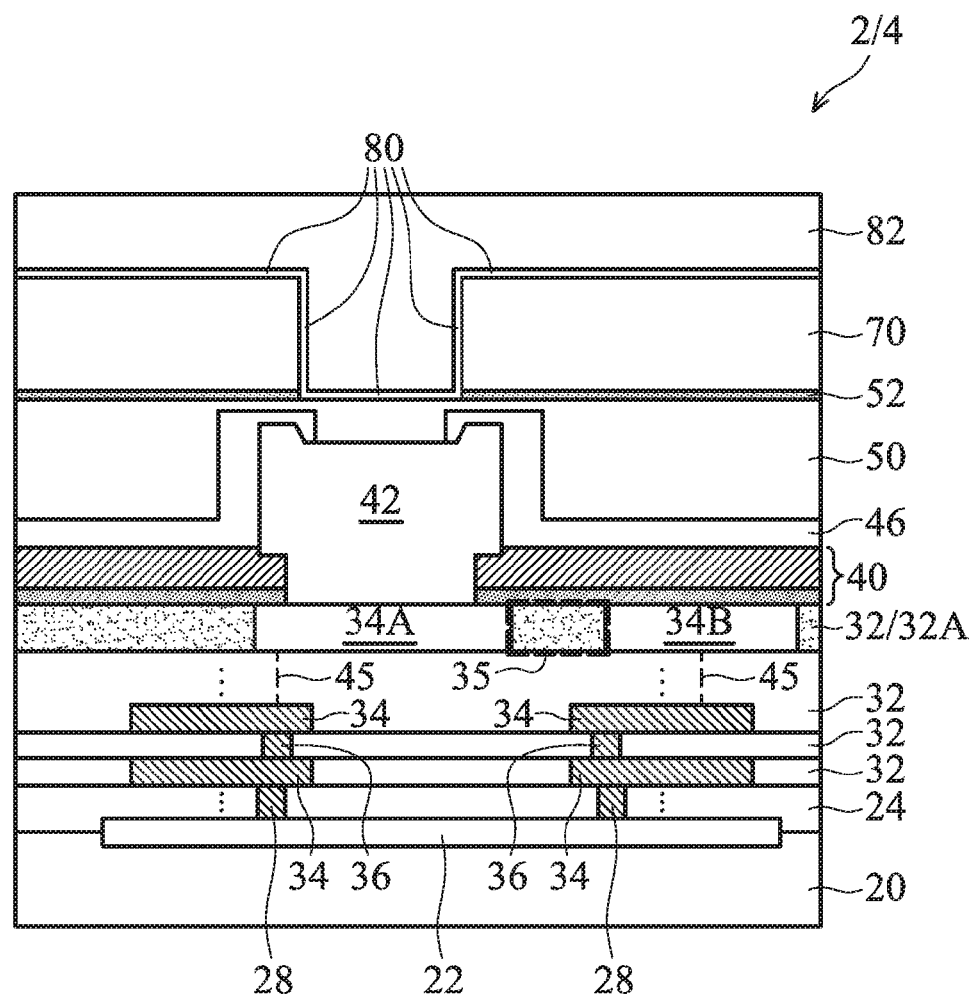
Figure 17:
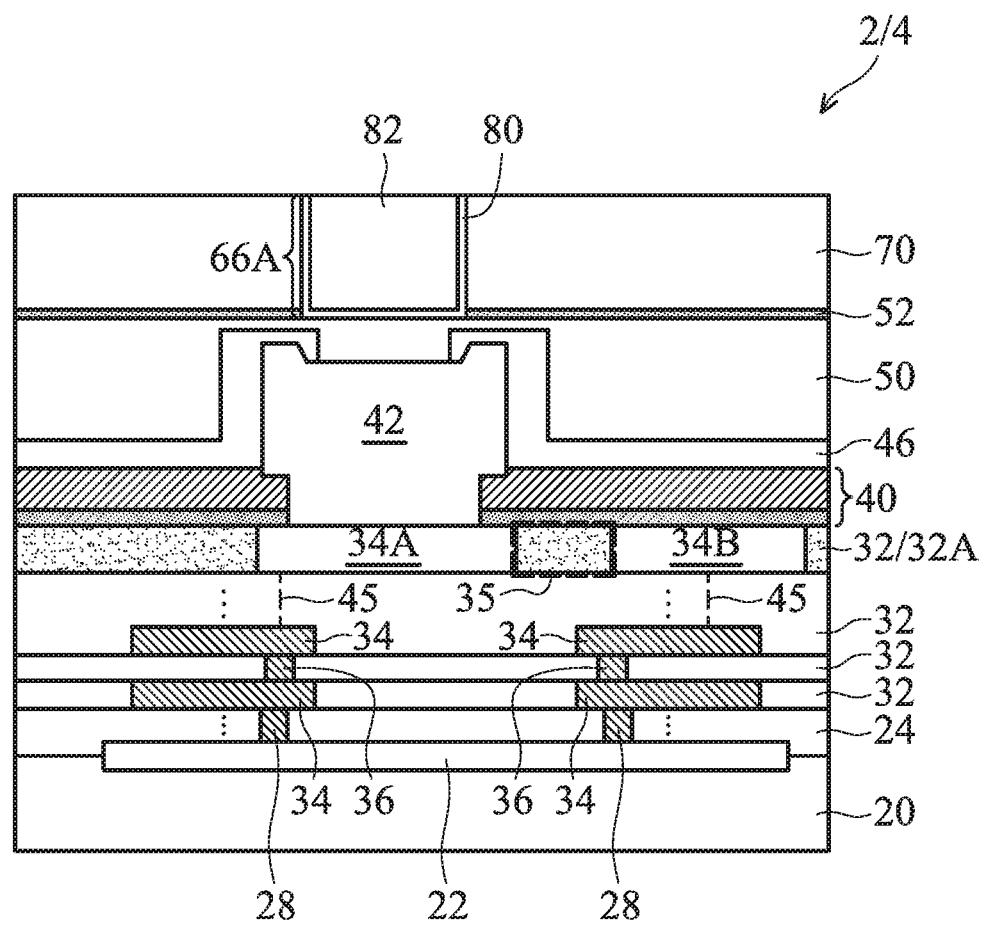

Referring to FIG. 16, conductive barrier layer 80 is deposited, which extends into opening 78 (FIG. 15). A portion of conductive barrier layer 80 is in contact with the top surface of dielectric etch stop layer 52 or dielectric layer 50. Conductive barrier layer 80 may be formed of titanium, tantalum, titanium nitride, or tantalum nitride in accordance with some embodiments. Next, conductive material 82 (such as copper or a copper alloy) is deposited. A planarization is then preformed to remove excess portions of conductive barrier layer 80 and conductive material 82, leaving bond pad 66A in dielectric layer 70, as shown in FIG. 17. The resulting bond pad 66A includes conductive barrier layer 80 contacting the sidewalls and the bottom of conductive material 82, and a copper-containing material 82.

Figure 18:
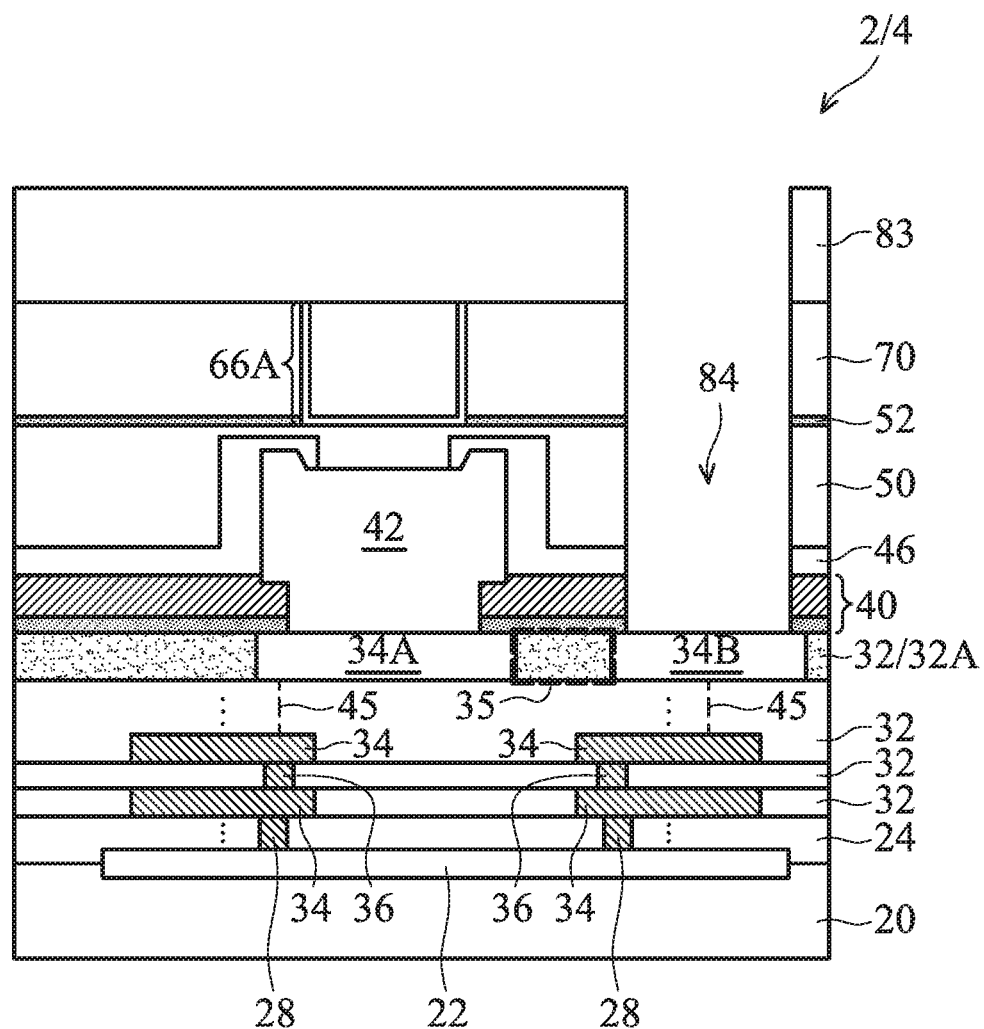

Referring to FIG. 18, photo resist 83 is applied and patterned, and is used to etch dielectric layers 70, 52, 50, 46, and 40 in order to form opening 84. The etching stops on metal feature 34B. Photo resist 83 is then removed.

Figure 19:
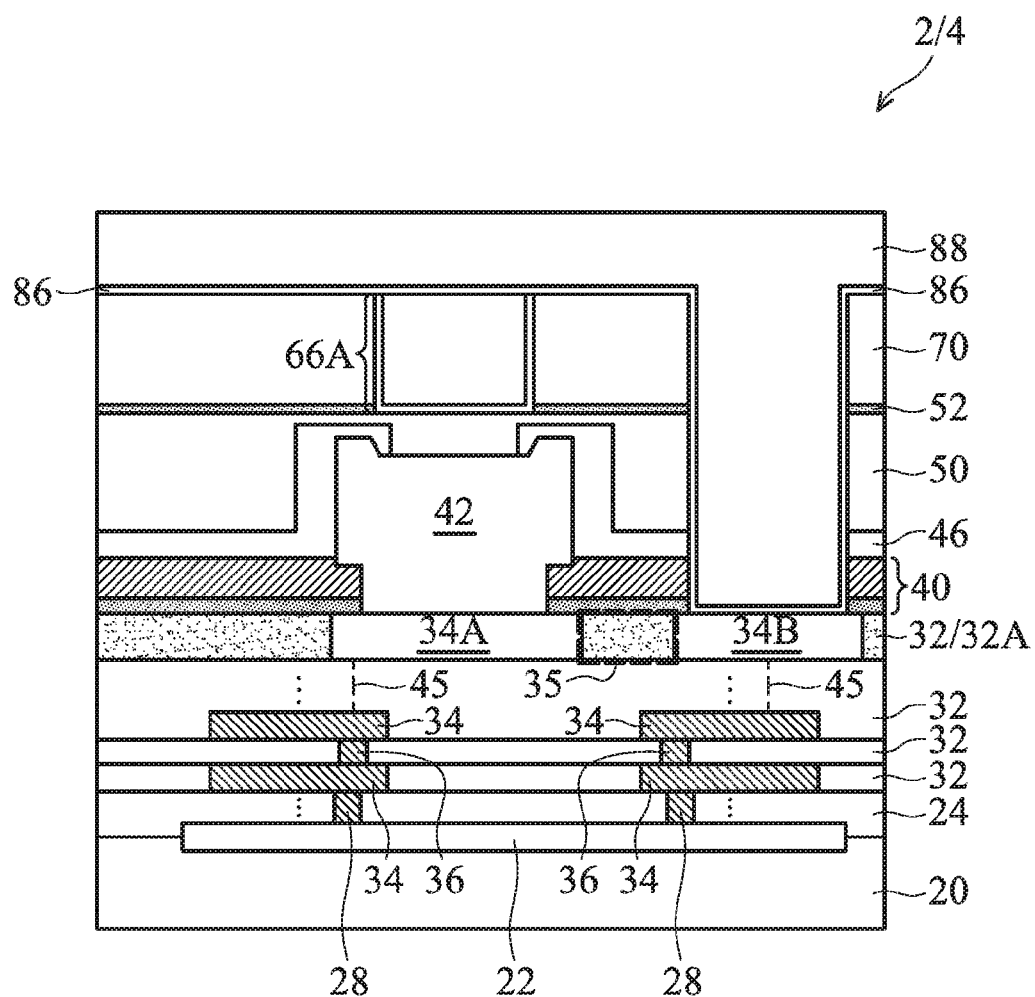
Figure 20:
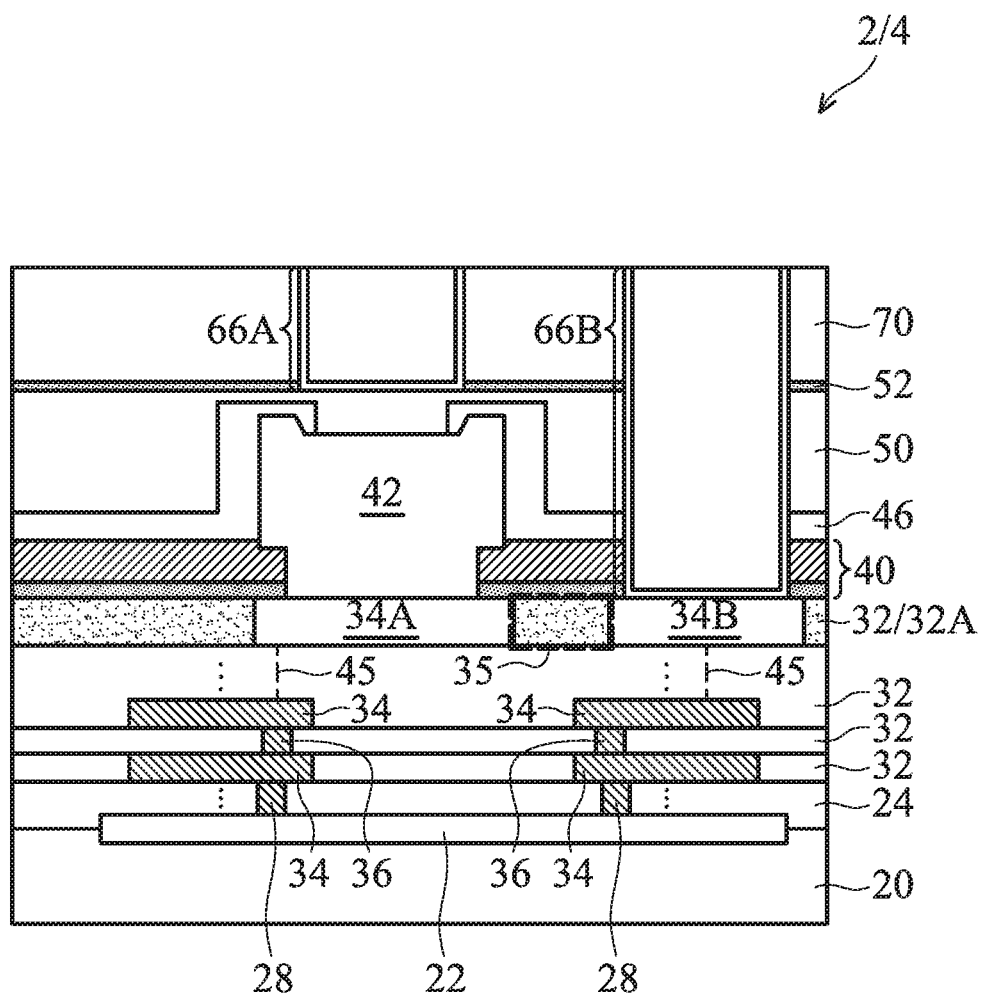
Figure 21:
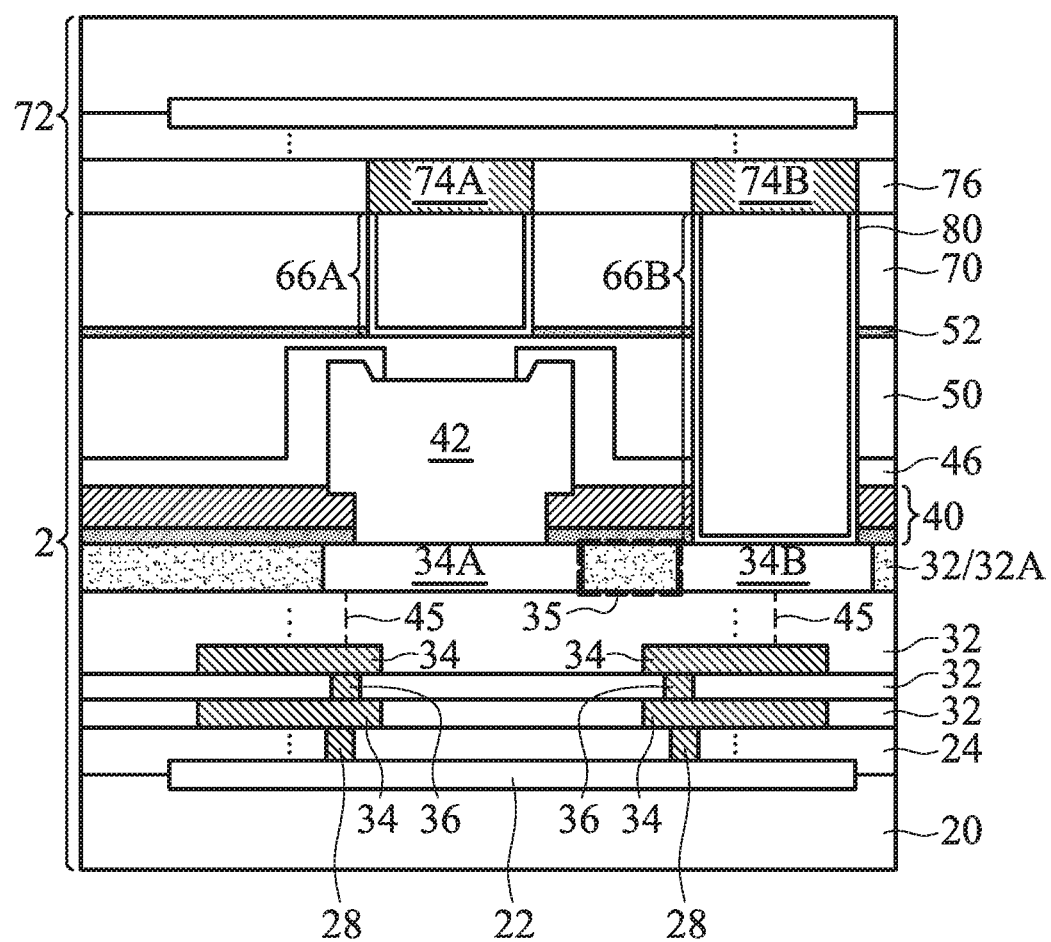

Referring to FIG. 19, conductive barrier layer 86 is deposited, which extends into opening 84 (FIG. 18). A portion of conductive barrier layer 86 extends over the top surface of dielectric layer 70. Conductive barrier layer 86 may be formed of titanium, tantalum, titanium nitride, or tantalum nitride in accordance with some embodiments. Next, copper-containing conductive material 88 is deposited. A planarization is then preformed to remove excess portions of conductive barrier layer 86 and conductive material 88, leaving bond pad 66B in dielectric layer 70, as shown in FIG. 20. FIG. 21 illustrates the bonding of package component 2 with package component 72.

In the embodiments shown in FIG. 21, bond pad 66B has straight (and substantially vertical) edges continuously extending from the top surface of dielectric layer 70 to metal feature 34B. Accordingly, there is no narrow via connecting bond pad 66B to metal feature 34B. Since dielectric layer 50 is thick (which may be 2 µm to 3 µm thick in some exemplary embodiments), if narrow vias are formed, the resistance of the vias will be very high. Accordingly, the adverse increase in the resistance caused by narrow vias is avoided in accordance with embodiments of the present disclosure.

Figure 22:
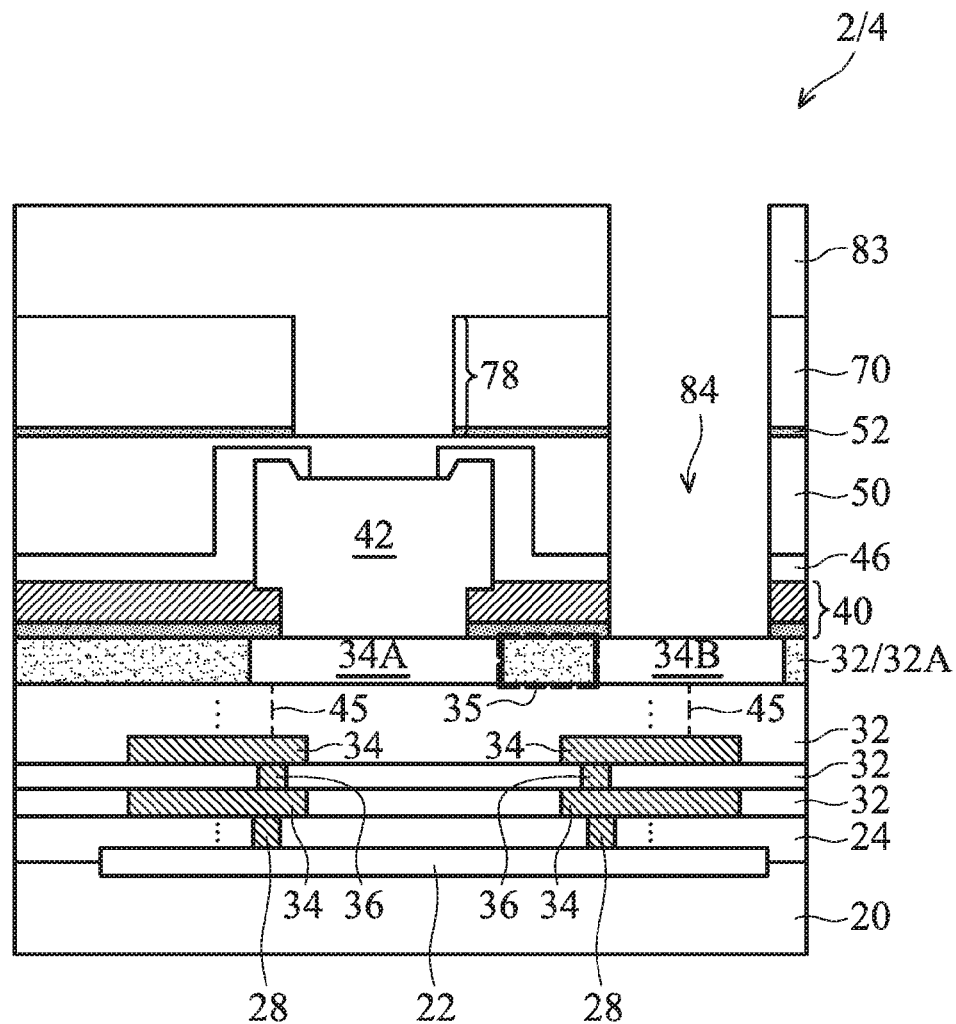
FIGS. 22 through 24 illustrate the cross-sectional views of intermediate stages in the formation of a bond structure accordance with some embodiments.
Figure 23:
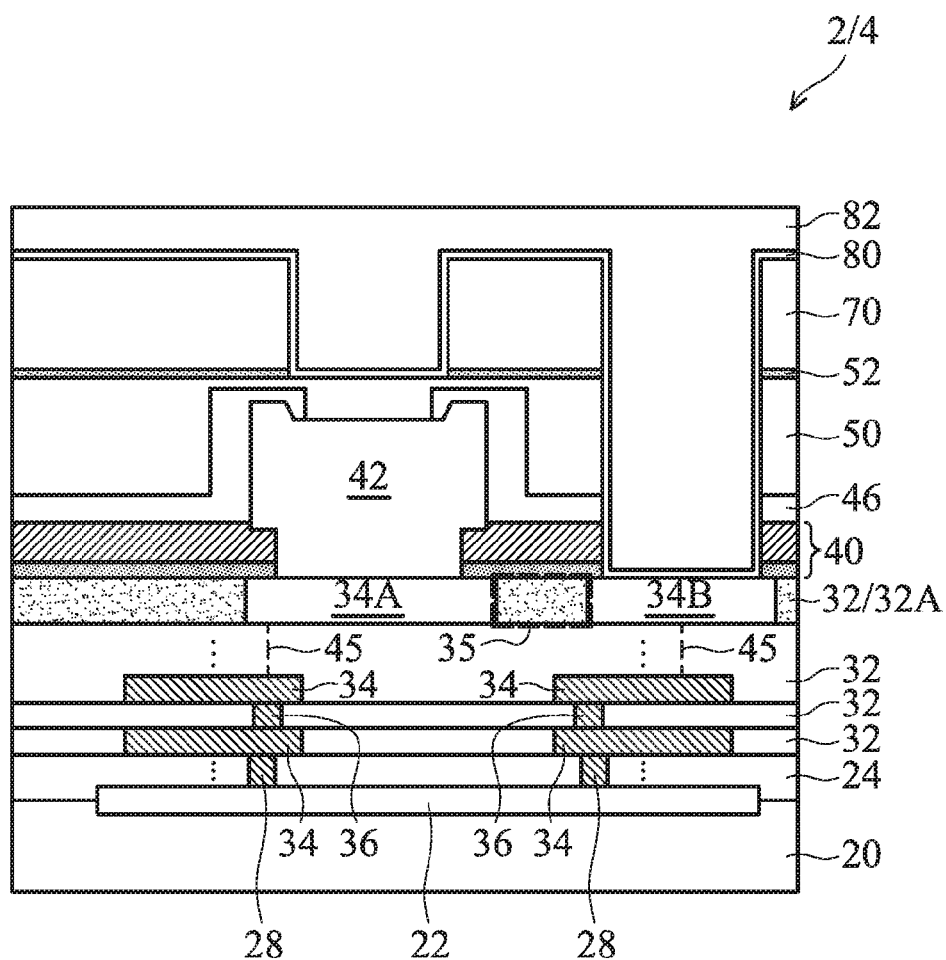
Figure 24:
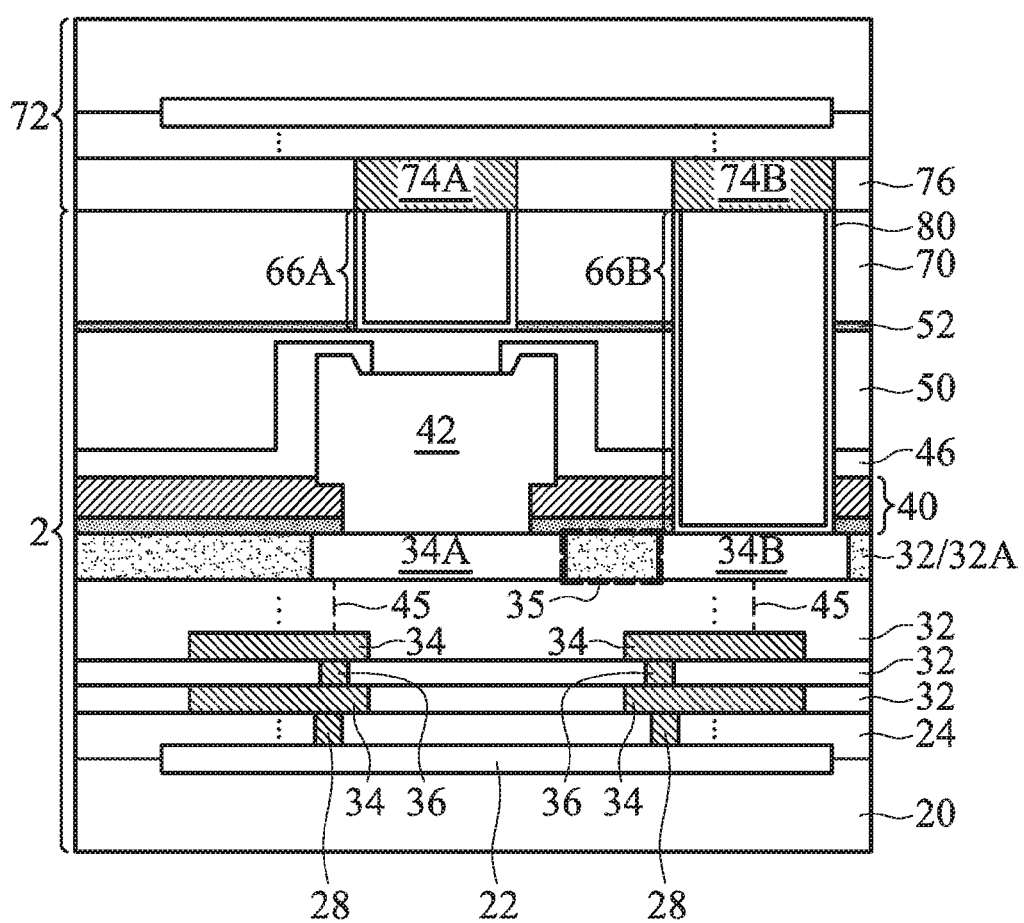

FIGS. 22 through 24 illustrate the cross-sectional views of intermediate stages in accordance with some embodiments. These embodiments are similar to the embodiments in FIGS. 12 through 21, except the gap-filling for forming bond pad 66A and the gap-filling for forming bond pad 66B are performed simultaneously. The initial process steps are the same as shown in FIGS. 12 through 15. Next, as shown in FIG. 22, photo resist 83 is formed and patterned. Photo resist 83 fills opening 78. Photo resist 83 is then used as an etching mask to etch dielectric layers, and hence opening 84 is formed. After the exposure of metal feature 34B, photo resist 83 is removed.

Next, as shown in FIG. 23, conductive barrier layer 80 and copper-containing metal 82 are formed, for example, in deposition and/or plating. A planarization is then performed to remove excess portions of conductive barrier layer 80 and copper-containing metal 82, leaving bond pads 66A and 66B, as shown in FIG. 24. Each of bond pads 66A and 66B includes a conductive barrier layer and a metal, with the conductive barrier on the sidewall and at the bottom of metal 82. FIG. 24 also illustrates the bonding of package component 2 with package component 72.

The embodiments of the present disclosure have some advantageous features. The embodiments of the present disclosure enable fin-pitch bonding. In accordance with some embodiments of the present disclosure, the preferred copper orientation (111) may be achieved, and the subsequent hybrid bonding is easier. The bonding quality is also improved. Furthermore, in accordance with some embodiments, by allowing bond pads to penetrate through the dielectric layer in which aluminum pads are formed, the resistance of the resulting structure is reduced.

In accordance with some embodiments of the present disclosure, a method includes forming a first conductive feature and a second conductive feature, forming a metal pad over and electrically connected to the first conductive feature, and forming a passivation layer covering edge portions of the metal pad, with a center portion of a top surface of the metal pad exposed through an opening in the metal pad. A first dielectric layer is formed to cover the metal pad and the passivation layer. A bond pad is formed over the first dielectric layer, and the bond pad is electrically coupled to the second conductive feature. A second dielectric layer is deposited to encircle the bond pad. A planarization is performed to level a top surface of the second dielectric layer with the bond pad. At a time after the planarization is performed, an entirety of the top surface of the metal pad is in contact with dielectric materials.

In accordance with some embodiments of the present disclosure, a method includes forming a first metal feature and a second metal feature simultaneously, forming an aluminum pad over and contacting the first metal feature, and forming a passivation layer covering edge portions of the aluminum pad, with a center portion of a top surface of the aluminum pad exposed through an opening in the passivation layer. The method further includes forming a first dielectric layer to cover the top surface of the aluminum pad and the passivation layer, forming a via penetrating through the first dielectric layer and the passivation layer to contact the second metal feature, forming a first bond pad and a second pad simultaneously, with the second bond pad being over and contacting the via, forming a second dielectric layer to embed the first bond pad and the second bond pad, and planarizing a top surface of the second dielectric layer to level the top surface of the second dielectric layer with top surfaces of the first bond pad and the second bond pad.

In accordance with some embodiments of the present disclosure, an integrated circuit structure includes a first metal feature and a second metal feature coplanar with each other, an aluminum pad over and contacting the first metal feature, and a passivation layer covering edge portions of the aluminum pad, with a center portion of a top surface of the aluminum pad exposed through an opening in the passivation layer. A first dielectric layer covers the top surface of the aluminum pad and the passivation layer, a via penetrating through the first dielectric layer and the passivation layer to contact the second metal feature. A first bond pad and a second pad are coplanar with each other, with the second bond pad being over and contacting the via. A second dielectric layer encircles the first bond pad and the second bond pad, wherein a top surface of the second dielectric layer and top surfaces of the first bond pad and the second bond pad are coplanar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first conductive feature and a second conductive feature;
    forming a metal pad over and electrically connected to the first conductive feature;
    forming a passivation layer covering edge portions of the metal pad, with a center portion of a top surface of the metal pad exposed through an opening in the passivation layer;
    depositing a first dielectric layer covering the metal pad and the passivation layer;
    forming a first bond pad through plating over the first dielectric layer, wherein the first bond pad is electrically coupled to the second conductive feature; and
    depositing a second dielectric layer, wherein the second dielectric layer encircles the first bond pad, and the forming the second dielectric layer comprises:
        depositing a dielectric barrier layer contacting a top surface and sidewalls of the first bond pad;
        depositing an additional dielectric layer over the dielectric barrier layer; and
        performing a planarization to remove excess portions of the dielectric barrier layer and the additional dielectric layer higher than the first bond pad.

2. The method of claim 1, wherein the first bond pad and the second dielectric layer are in a first package component, and the method further comprises bonding the first bond pad and the second dielectric layer with a second package component through hybrid bonding.

3. The method of claim 2, wherein the first bond pad and the second dielectric layer are in physical contact with an additional bond pad and an additional dielectric layer, respectively, in the second package component.

4. The method of claim 1 further comprising performing a planarization on the second dielectric layer and the first bond pad, wherein at a time after the first bond pad is formed, the top surface of the metal pad is not connected to conductive features.

5. The method of claim 1 further comprising forming a via in the first dielectric layer, wherein the via physically connects the second conductive feature to the first bond pad.

6. The method of claim 1 further comprising forming a second bond pad simultaneously as the first bond pad, wherein the second bond pad is a dummy pad.

7. A method comprising:
    forming a first metal feature and a second metal feature;
    forming a metal pad over and contacting the first metal feature;
    forming a passivation layer covering edge portions of the metal pad, with a center portion of a top surface of the metal pad exposed through an opening in the passivation layer;
    forming a first dielectric layer to cover the top surface of the metal pad and the passivation layer;
    forming a via penetrating through the first dielectric layer and the passivation layer to contact the second metal feature;
    forming a first bond pad and a second bond pad simultaneously, with the second bond pad being over and contacting the via;
    forming a second dielectric layer to embed the first bond pad and the second bond pad; and
    planarizing a top surface of the second dielectric layer to level the top surface of the second dielectric layer with top surfaces of the first bond pad and the second bond pad.

8. The method of claim 7, wherein the first bond pad is electrically floating.

9. The method of claim 7 further comprising, before the forming the second dielectric layer, forming a dielectric barrier layer on sidewalls and top surfaces of the first bond pad and the second bond pad.

10. The method of claim 7, wherein the first bond pad is physically isolated from all other conductive features in a respective chip.

11. The method of claim 7, wherein after the planarizing, an entirety of the top surface of the metal pad is in contact with dielectric materials.

12. The method of claim 11, wherein after the planarizing, all sidewalls of the metal pad are in contact with dielectric materials.

13. The method of claim 7, wherein the forming the via and the forming the second bond pad are performed in separate single damascene processes.

14. The method of claim 7 further comprising probing by contacting a probe needle to the top surface of the metal pad.

15. The method of claim 7 further comprising bond the first bond pad and the second bond pad to bond pads of a package component, with the first bond pad and the second bond pad being in physical contact with the bond pads in the package component.

16. The method of claim 7, wherein the first bond pad overlaps the metal pad, and the first bond pad is a dummy pad.

17. A method comprising:
forming a first conductive pad and a second conductive pad at a same level, wherein the first conductive pad is electrically connected to the second conductive pad through a conductive line;
forming a metal pad over and contacting the first conductive pad;
probing the metal pad;
depositing a first dielectric layer covering the metal pad;
forming a dielectric etch stop layer over the first dielectric layer;
forming a second dielectric layer over the dielectric etch stop layer;
forming a first bond pad in the second dielectric layer, wherein the first bond pad overlaps a portion of the first dielectric layer, and is a dummy bond pad; and
forming a second bond pad penetrating through the second dielectric layer, the dielectric etch stop layer, and the first dielectric layer to contact the second conductive pad.

18. The method of claim 17 further comprising forming a passivation layer covering edge portions of the metal pad, with the probing performed through an opening in the passivation layer, and the first dielectric layer covers the passivation layer.

19. The method of claim 17, wherein the first bond pad and the second dielectric layer are in a first package component, and the method further comprises bonding the first bond pad and the second dielectric layer with a second package component through hybrid bonding.

20. The method of claim 19, wherein at a time the bonding is performed, an entire top surface of the metal pad is in contact with dielectric materials.

* * * * *